(12) United States Patent
Lim et al.

(10) Patent No.: US 12,332,320 B2
(45) Date of Patent: Jun. 17, 2025

(54) BATTERY MANAGEMENT APPARATUS AND METHOD

(71) Applicant: LG ENERGY SOLUTION, LTD., Seoul (KR)

(72) Inventors: Bo Mi Lim, Daejeon (KR); Yo Hwan Choi, Daejeon (KR); Won Tae Joe, Daejeon (KR); Bom Jin Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 80 days.

(21) Appl. No.: 18/265,208

(22) PCT Filed: Jan. 4, 2022

(86) PCT No.: PCT/KR2022/000067
§ 371 (c)(1),
(2) Date: Jun. 2, 2023

(87) PCT Pub. No.: WO2022/149824
PCT Pub. Date: Jul. 14, 2022

(65) Prior Publication Data
US 2024/0027537 A1 Jan. 25, 2024

(30) Foreign Application Priority Data
Jan. 8, 2021 (KR) ........................ 10-2021-0002907

(51) Int. Cl.
*G01R 31/392* (2019.01)
*G01R 31/367* (2019.01)
(Continued)

(52) U.S. Cl.
CPC ......... *G01R 31/392* (2019.01); *G01R 31/367* (2019.01); *G01R 31/3842* (2019.01);
(Continued)

(58) Field of Classification Search
None
See application file for complete search history.

(56) References Cited

U.S. PATENT DOCUMENTS

| | | |
|---|---|---|
| 4,433,294 A | 2/1984 | Windebank |
| 2010/0312733 A1 | 12/2010 | Song et al. |

(Continued)

FOREIGN PATENT DOCUMENTS

| | | |
|---|---|---|
| CN | 109061495 A | 12/2018 |
| JP | 2008-232989 A | 10/2008 |

(Continued)

OTHER PUBLICATIONS

Extended European Search Report for European Application No. 22736801.6, dated Apr. 29, 2024.
(Continued)

*Primary Examiner* — Jas A Sanghera
(74) *Attorney, Agent, or Firm* — Birch, Stewart, Kolasch & Birch, LLP

(57) ABSTRACT

Provided is a battery management apparatus including a measuring unit measuring a current and a voltage of battery cells, an analyzing unit classifying the battery cells into a plurality of classes based on a feature obtained from the current and the voltage of the battery cells and a degradation behavior of each of the battery cells, and a determining unit determining a lifespan of the battery cells in a preset manner for each of the plurality of classes.

20 Claims, 7 Drawing Sheets

(51) Int. Cl.
*G01R 31/3842* (2019.01)
*G01R 31/396* (2019.01)
*H02J 7/00* (2006.01)

(52) U.S. Cl.
CPC .......... *G01R 31/396* (2019.01); *H02J 7/0013* (2013.01); *H02J 7/005* (2020.01)

(56) References Cited

U.S. PATENT DOCUMENTS

| | | |
|---|---|---|
| 2011/0191278 A1 | 8/2011 | Song et al. |
| 2014/0176024 A1 | 6/2014 | Butzmann et al. |
| 2016/0105044 A1 | 4/2016 | Yamaguchi et al. |
| 2016/0195587 A1 | 7/2016 | Lee |
| 2016/0209473 A1 | 7/2016 | You et al. |
| 2016/0239759 A1 | 8/2016 | Sung |
| 2017/0023649 A1 | 1/2017 | You et al. |
| 2019/0113577 A1 | 4/2019 | Severson et al. |
| 2020/0284846 A1 | 9/2020 | Pajovic et al. |
| 2021/0090159 A1 | 3/2021 | Toya |
| 2021/0293890 A1* | 9/2021 | Gorrachategui ..... G01R 31/367 |
| 2022/0214399 A1* | 7/2022 | Liaw ................... G01R 31/387 |

FOREIGN PATENT DOCUMENTS

| | | |
|---|---|---|
| JP | 2014-79067 A | 5/2014 |
| JP | 2016-77139 A | 5/2016 |
| JP | 2018-170771 A | 9/2016 |
| JP | 2017-73371 A | 4/2017 |
| JP | 2020-43697 A | 3/2020 |
| JP | 2020-198733 A | 12/2020 |
| KR | 10-2009-0020362 A | 2/2009 |
| KR | 10-2013-0073968 A | 7/2013 |
| KR | 10-1440719 B1 | 9/2014 |
| KR | 10-2015-0046599 A | 4/2015 |
| KR | 10-2016-0085070 A | 7/2016 |
| KR | 10-2016-0090140 A | 7/2016 |
| KR | 10-2016-0101506 A | 8/2016 |
| KR | 10-2016-0107095 A | 9/2016 |
| KR | 10-1655583 B1 | 9/2016 |
| KR | 10-2017-0003565 A | 1/2017 |
| KR | 10-2017-0011010 A | 2/2017 |
| KR | 10-2020-0119383 A | 10/2020 |
| WO | WO 2020/179120 A1 | 9/2020 |

OTHER PUBLICATIONS

Fermin-Cueto et al., "Identification and machine learning prediction of knee-point and knee-onset in capacity degradation curves of lithium-ion cells," Elsevier, Energy and AI, Aug. 1, 2020, pp. 1-10.
Pajovic et al., "A Data-Driven Method for Predicting Capacity Degradtion of Rechargeable Batteries ," IEEE, vol. 1. Jul. 22, 2019, pp. 1259-1265.
International Search Report (PCT/ISA/210) issued in PCT/KR2022/000067, dated Apr. 12, 2022.

* cited by examiner

BATTERY MANAGEMENT APPARATUS AND METHOD

CROSS-REFERENCE TO RELATED APPLICATION

This application claims priority to and the benefit of Korean Patent Application No. 10-2021-0002907 filed in the Korean Intellectual Property Office on Jan. 8, 2021, the entire contents of which are incorporated herein by reference.

TECHNICAL FIELD

Embodiments disclosed herein relate to a battery management apparatus and method.

BACKGROUND ART

Recently, research and development of secondary batteries have been actively performed. Herein, the secondary batteries, which are chargeable/dischargeable batteries, may include all of conventional nickel (Ni)/cadmium (Cd) batteries, Ni/metal hydride (MH) batteries, etc., and recent lithium-ion batteries. Among the secondary batteries, a lithium-ion battery has a much higher energy density than those of the conventional Ni/Cd batteries, Ni/MH batteries, etc. Moreover, the lithium-ion battery may be manufactured to be small and lightweight, such that the lithium-ion battery has been used as a power source of mobile devices. In addition, the lithium ion battery is attracting attention as a next-generation energy storage medium as a usage range thereof is expanded to a power source of electric vehicles.

Furthermore, the secondary battery is generally used as a battery pack including a battery module where a plurality of battery cells are connected to one another in series and/or in parallel. The battery pack may be managed and controlled by a battery management system in terms of a state and an operation.

To calculate a capacity of a battery cell, generally, a calculation equation such as Ah counting, etc., may be used after charging and discharging of the battery cell are all completed. To release such a battery cell, the battery cell may be previously charged or discharged up to 300 cycles to check a capacity degradation rate, after which the battery cell is released. However, discharging of the battery cell up to 300 cycles may consume much time and cost.

DISCLOSURE

Technical Problem

Embodiments disclosed herein aims to provide a battery management apparatus and method in which a lifespan of a battery cell may be predicted early by classifying battery cells into classes based on data indicating degradation characteristics of the battery cells for capacity estimation.

Technical problems of the embodiments disclosed herein are not limited to the above-described technical problems, and other unmentioned technical problems would be clearly understood by one of ordinary skill in the art from the following description.

Technical Solution

A battery management apparatus disclosed herein includes a measuring unit configured to measure a current and a voltage of battery cells, an analyzing unit configured to classify the battery cells into a plurality of classes based on a feature obtained from the current and the voltage of the battery cells and a degradation behavior of each of the battery cells, and a determining unit configured to determine a lifespan of the battery cells in a preset manner for each of the plurality of classes.

According to an embodiment, the analyzing unit may be further configured to exclude a battery cell having discontinuity in the feature among the battery cells from the lifespan determination.

According to an embodiment, the analyzing unit may be further configured to classify the battery cells into the plurality of classes based on a change pattern of the feature.

According to an embodiment, the change pattern of the feature may include an initial value of the feature and a change rate for a cycle.

According to an embodiment, the analyzing unit may be further configured to classify as a first class, a first battery cell among the battery cells for which a lifespan of the first battery cell is determined to be normal based on a feature of the first battery cell in a state where charging and discharging are performed on the first battery cell up to a first cycle.

According to an embodiment, the analyzing unit may be further configured to classify a second battery cell among the battery cells not belonging to the first class as a second class in which lifespan determination is possible in a state where charging and discharging are performed on the second battery cell up to a second cycle, and the second cycle has a value greater than the first cycle.

According to an embodiment, the determining unit may be further configured to determine the lifespan of the battery cell by applying the feature of the second battery cell to a regression model in a state where charging and discharging are performed on the second battery cell up to the second cycle.

According to an embodiment, the analyzing unit may be further configured to classify the battery cells into the plurality of classes based on a coefficient of an approximate equation for the feature.

According to an embodiment, the analyzing unit may be further configured to perform K-means clustering on the coefficient of the approximate equation.

A battery management method disclosed herein includes measuring a current and a voltage of battery cells, classifying the battery cells into a plurality of classes based on a feature obtained from the current and the voltage of the battery cells and a degradation behavior of each of the battery cells, and determining a lifespan of the battery cells in a preset manner for each of the plurality of classes.

According to an embodiment, the battery management method may further include excluding a battery cell having discontinuity in the feature among the battery cells from the lifespan determination.

According to an embodiment, the classifying of the battery cells into the plurality of classes may include classifying the battery cells into the plurality of classes based on a change pattern of the feature.

According to an embodiment, the classifying of the battery cells into the plurality of classes may include classifying the battery cells into the plurality of classes based on a slope of the feature.

According to an embodiment, the classifying of the battery cells into the plurality of classes may include classifying as a first class, a first battery cell for which a lifespan of the first battery cell is determined to be normal based on a feature of the first battery cell in a state where charging and discharging are performed on the first battery cell up to a first cycle.

According to an embodiment, the classifying of the battery cells into the plurality of classes may include classifying a second battery cell not belonging to the first class as a second class in which lifespan determination of the second battery cell is possible in a state where charging and discharging are performed on the second battery cell up to a second cycle, and the second cycle has a value greater than the first cycle.

According to an embodiment, the determining of the lifespan of the battery cell may include applying the feature of the second battery cell to a regression model in a state where charging and discharging are performed on the second battery cell up to the second cycle.

Advantageous Effects

A battery management apparatus and method according to an embodiment disclosed herein may early predict a lifespan of a battery cell by classifying battery cells into classes based on data indicating degradation characteristics of the battery cells for capacity estimation.

MODE FOR INVENTION

Figure 1:
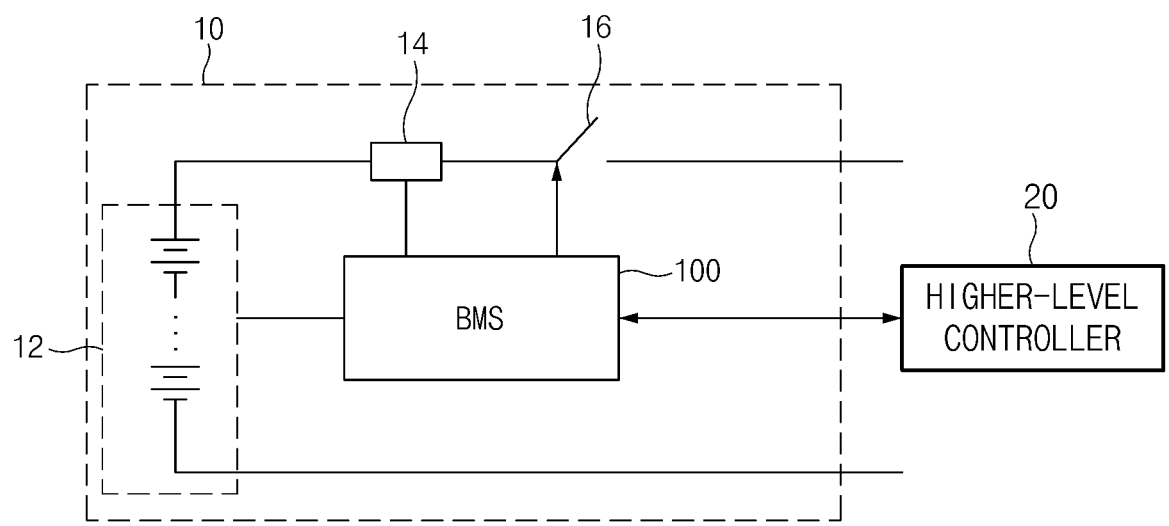
FIG. 1 is a block diagram of a general battery pack including a battery management apparatus according to an embodiment disclosed herein.

Hereinafter, various embodiments disclosed herein will be described in detail with reference to the accompanying drawings. In this document, identical reference numerals will be used for identical components in the drawings, and the identical components will not be redundantly described.

For various embodiments disclosed herein, specific structural or functional descriptions are only exemplified for the purpose of describing the embodiments, and various embodiments disclosed herein may be implemented in various forms, and should not be construed as being limited to the embodiments described herein.

As used in various embodiments, the terms "1st", "2nd", "first", "second", or the like may modify various components regardless of importance, and do not limit the components. For example, a first component may be named as a second component without departing from the right scope of an embodiment disclosed herein, and similarly, the second component may be named as the first component.

Terms used in the present document are used for only describing a specific exemplary embodiment of the disclosure and may not have an intention to limit the scope of other exemplary embodiments of the disclosure. It is to be understood that the singular forms include plural references unless the context clearly dictates otherwise.

All terms including technical and scientific terms used herein have the same meaning as commonly understood by one of ordinary skill in the art to which the embodiments disclosed herein belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. In some cases, the terms defined herein may be interpreted to exclude embodiments disclosed herein.

FIG. 1 is a block diagram of a general battery pack including a battery management apparatus according to an embodiment disclosed herein.

More specifically, FIG. 1 schematically shows a battery control system 1 including a battery pack 10 and a higher-level controller 20 included in a higher-level system according to an embodiment disclosed herein.

As shown in FIG. 1, the battery pack 10 may include a plurality of battery modules 12, a sensor 14, a switching unit 16, and a battery management system 100. The battery pack 10 may include the battery module 12, the sensor 14, the switching unit 16, and the battery management system 100 provided in plural.

The plurality of battery modules 12 may include at least one chargeable/dischargeable battery cells. In this case, the plurality of battery modules 12 may be connected in series or in parallel.

The sensor 14 may detect current flowing in the battery pack 10. In this case, a detected signal may be transmitted to the battery management system 100.

The switching unit 16 may be connected in series to a (+) terminal side or a (−) terminal side of the battery module 12 to control the charging/discharging current flow of the battery module 12. For example, the switching unit 16 may use at least one relay, a magnetic contactor, etc., according to the specifications of the battery pack 10.

The battery management system 100 may monitor the voltage, current, temperature, etc., of the battery pack 10 to perform control and management to prevent overcharging and overdischarging, etc., and may include, for example, an RBMS (Rack Battery Management System).

The battery management system 100, which is an interface for receiving measurement values of the above-described various parameter values, may include a plurality of terminals and a circuit, etc., connected thereto to process input values. The battery management system 100 may control on/off of the switching unit 16, e.g., a relay, a contactor, etc., and may be connected to the battery module 12 to monitor the state of each battery module 12.

Meanwhile, the battery management system 100 disclosed herein may calculate a feature and a degradation behavior through a separate program based on a voltage and a current of a battery cell measured as will be described below, and classify them into a plurality of classes to estimate the lifespan of the battery cell.

The higher-level controller 20 may transmit a control signal for controlling the battery module 12 to the battery management system 100. Thus, the battery management system 100 may be controlled in terms of an operation thereof based on a signal applied from the higher-level controller 20. Also, the battery module 12 may be a component included in an energy storage system (ESS). In this case, the higher-level controller 20 may be a controller of a battery bank (BBMS) including the plurality of packs 10 or an ESS controller for controlling the entire ESS including a plurality of banks. However, the battery pack 10 is not limited to such a purpose.

Such configurations of the battery pack 10 and the battery management system 100 are well-known configurations, and thus will not be described in detail.

Figure 2:
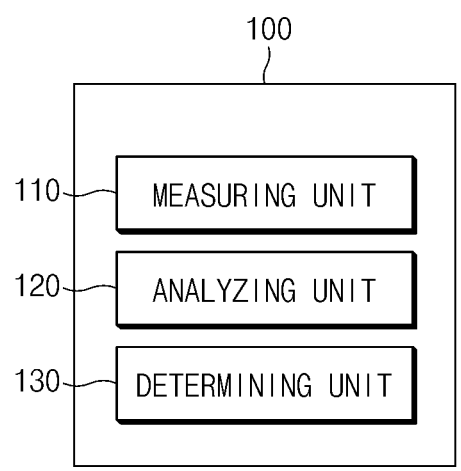
FIG. 2 is a block diagram illustrating a structure of a battery management apparatus, according to an embodiment disclosed herein.

FIG. 2 is a block diagram illustrating a structure of a battery management apparatus, according to an embodiment disclosed herein.

Referring to FIG. 2, the battery management apparatus 100 according to an embodiment disclosed herein may include a measuring unit 110, an analyzing unit 120, and a determining unit 130.

The measuring unit 110 may measure a voltage and a current of battery cells. The measuring unit 110 may measure the voltage and the current of the battery cell at specific time intervals. The voltage and the current measured by the measuring unit 110 may be used to calculate a feature for each of the battery cells. For example, the feature of the battery cell may be a value calculated based on a differential value (dQ/dV) of a capacity with respect to a voltage of the battery cell.

The analyzing unit 120 may classify battery cells into a plurality of classes based on a feature obtained from the current and the voltage of the battery cells and a degradation behavior of each battery cell. More specifically, the analyzing unit 120 may classify the battery cells into the plurality of classes based on a feature change pattern. For example, the feature change pattern may include an initial value of the feature, a change rate (slope) of the feature with respect to a cycle, etc.

The analyzing unit 120 may exclude a battery cell having discontinuity of a feature among the battery cells from lifespan determination. That is, battery cells including noise caused by static or an error in feature data may be regarded as including abnormality occurring in an experiment process or data calculation, making it impossible to early predict their capacities, and thus may be excluded from analysis. In this case, the battery cell excluded from lifespan determination may be charged and discharged up to cycles (e.g., 300 cycles) set as conventionally and then their capacities may be estimated.

The analyzing unit 120 may classify as a first class, a battery cell for which a lifespan of the battery cell may be determined to be normal based on a feature of the battery cell in a state where the battery cell is charged and discharged up to a first cycle. For example, the first cycle may be 36 cycles. That is, according to the battery management apparatus disclosed herein, capacity estimation may be performed more quickly than with a conventional method of predicting the lifespan after charging and discharging up to 300 cycles.

The analyzing unit 120 may classify a battery cell that does not belong to the first class as a second class in which the lifespan of the battery cell may be determined in a state where the battery cell is charged and discharged up to a second cycle. The second cycle may be greater than the first cycle, and may be 100 cycles. That is, the analyzing unit 120 may estimate a capacity through a separate estimation model even without charging and discharging a battery cell up to 300 cycles, in which the capacity of the battery cell may not be determined with data up to the first cycle (e.g., 36 cycles), but may be determined with data up to the second cycle that is greater than the first cycle.

The analyzing unit 120 may calculate an approximate equation regarding the obtained feature data and classify battery cells into a plurality of classes based on a coefficient of the approximate equation. At this time, the approximate equation may be a first-order or second-order polynomial. For example, the analyzing unit 120 may classify battery cells into a plurality of classes (clusters) according to a degradation behavior by performing K-means clustering on the coefficient of the approximate equation.

The determining unit 130 may determine the lifespan of the battery cell according to a preset method for each of the plurality of classes. More specifically, the determining unit 130 may charge and discharge battery cells, classified as the first class by the analyzing unit 120, up to the first cycle and then early determine that a degradation degree is normal. The determining unit 130 may charge and discharge a battery cell, classified as the second class by the analyzing unit 120, up to the second cycle and then apply an extracted feature of the battery cell to a regression model, thus determining the lifespan of the battery cell.

Herein, the regression model may be a capacity estimation model capable of calculating an SOH value after 300 cycles based on data from 1 to 100 cycles. For example, the regression model is one of neural network methods using machine learning, and may use an estimation model such as an elastic net, etc.

Meanwhile, although not shown in FIG. 2, the battery management apparatus 100 disclosed herein may include a storing unit. In this case, the storing unit may store various data such as a voltage and a current of a battery cell, a feature of the battery cell, data regarding the first and second classes, etc. Meanwhile, the battery management apparatus 100 of FIG. 1 may include a communication unit (not shown) instead of the storing unit. In this case, the battery management apparatus 100 may operate by storing various data for each battery cell in an external server and transmitting and receiving the data through the communication unit.

As such, a battery management apparatus according to an embodiment disclosed herein may early predict a lifespan of a battery cell by classifying battery cells into classes based on data indicating degradation characteristics of the battery cells for capacity estimation.

Figure 3:
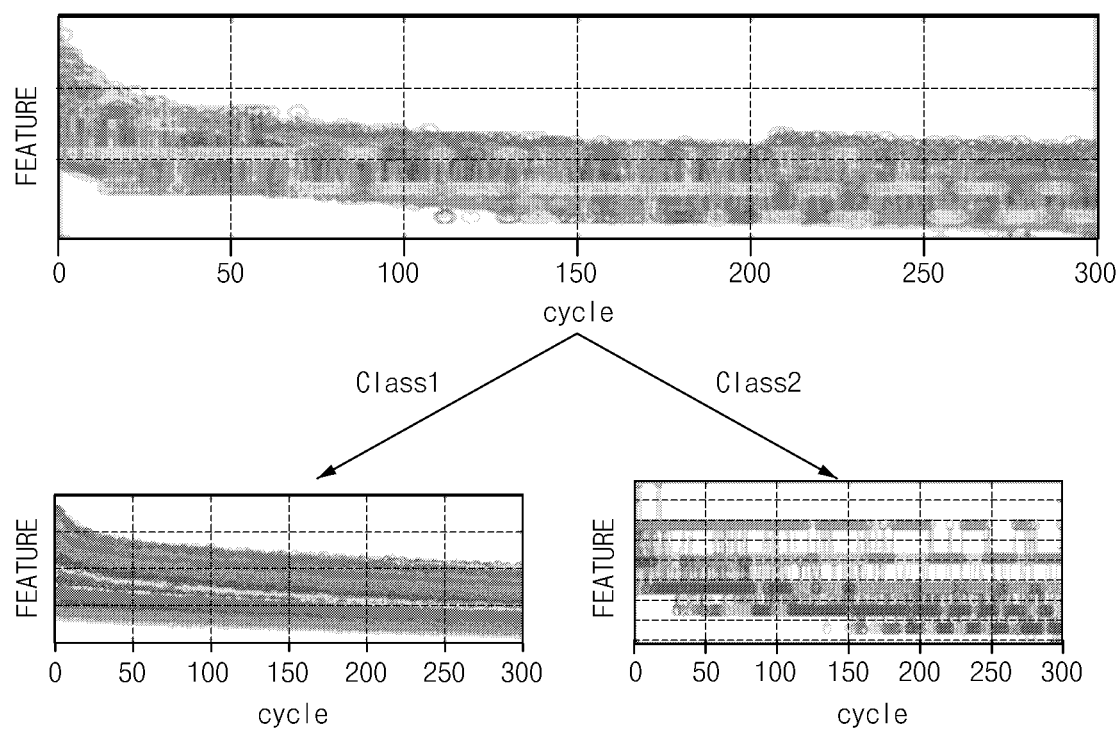
FIG. 3 shows that a battery management apparatus according to an embodiment disclosed herein filters feature data of a battery cell.

FIG. 3 shows that a battery management apparatus according to an embodiment disclosed herein filters feature data of a battery cell.

Referring to FIG. 3, a graph showing a feature change pattern for a cycle of each of a plurality of battery cells is shown. In FIG. 3, a horizontal axis indicates the number of charging and discharging cycles of a battery cell and a vertical axis indicates a feature of the battery cell. For example, the feature may be a differential value (dQ/dV) of a capacity with respect to a voltage of the battery cell.

As shown in FIG. 3, in feature data calculated for each of the plurality of battery cells, data that appears smooth usually as continuous values and data out of a tendency as discontinuous values due to noise, etc., are mixed. It is difficult to obtain a result value from such discontinuous feature data through statistical analysis without correction for smoothing.

As such, the battery management apparatus disclosed herein may classify battery cells with discontinuity in features among battery cells as a separate class in advance to exclude them from lifespan determination, thereby accurately and easily performing analysis with respect to the features.

Figure 4:
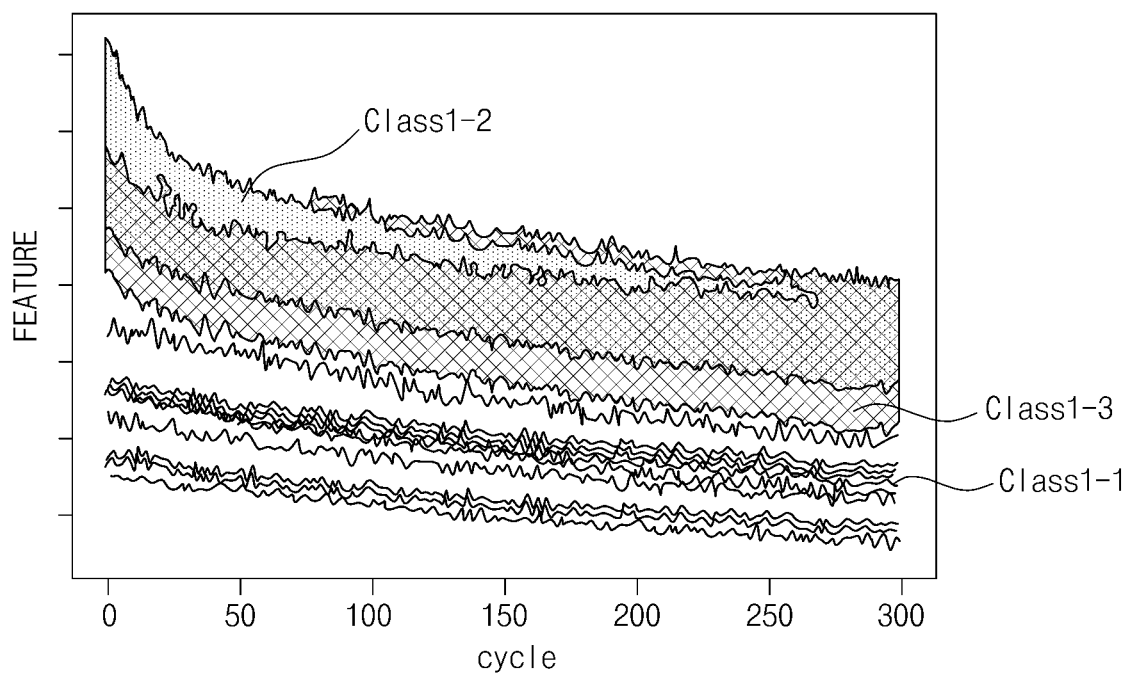
FIG. 4 shows that a battery management apparatus according to an embodiment disclosed herein classifies battery cells into classes based on feature data of the battery cells.

FIG. 4 shows that a battery management apparatus according to an embodiment disclosed herein classifies battery cells into classes based on feature data of the battery cells.

Referring to FIG. 4, a feature change pattern for a charging and discharging cycle of battery cells is shown separately for a plurality of classes. Class 1-1 indicates the above-described first class, and Class 1-2 and Class 1-3 indicate the above-described second class. Classes shown in FIG. 4 may have been classified through K-means clustering analysis. For example, the feature of FIG. 4 may be a differential value of a capacity with respect to a voltage of the battery cell.

As shown in FIG. 4, in battery cells belonging to Class 1-1, a slope of a feature with respect to a cycle is gentler than that in Class 1-2 and Class 1-3. That is, for a battery cell belonging to Class 1-1, a change in a feature having a high correlation with an SOH is relatively small, such that capacity degradation may occur less than other battery cells.

As such, as a result of performing analysis with the battery management apparatus disclosed herein, when the battery cell belongs to Class 1-1, i.e., the first class, charging and discharging may be performed a specific number of cycles (e.g., 36 cycles), and then the battery cell may be early determined to have a normal degradation degree without further performing charging and discharging. When the battery cell belongs to Class 1-2 or 1-3, i.e., the second class, charging and discharging may be performed a number of cycles (e.g., 100 cycles) greater than or equal to a certain value, and then the capacity of the battery cell may be predicted through the above-described regression model. For example, the regression models applied to Class 1-2 and Class 1-3 indicating some other degradation behaviors may have different initial values, calculation conditions, etc.

Figure 5:
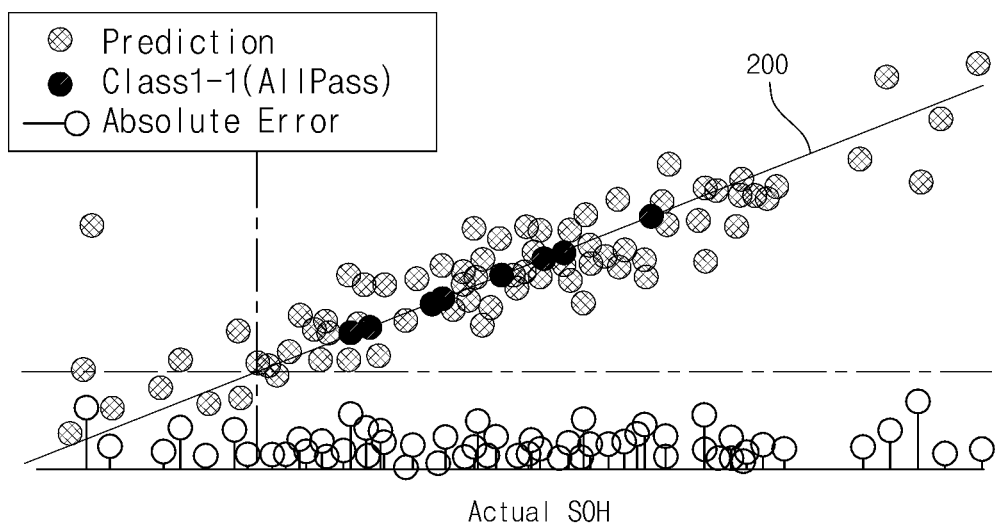
FIG. 5 shows a result of determining a lifespan of a battery cell through a battery management apparatus according to an embodiment disclosed herein.

FIG. 5 shows a result of determining a lifespan of a battery cell through a battery management apparatus according to an embodiment disclosed herein.

Referring to FIG. 5, an SOH (Prediction) of battery cells, calculated through classification as Class 1-2 and Class 1-3 described in FIG. 4 by the battery management apparatus according to an embodiment disclosed herein, and an SOH (All Pass) of battery cells determined to have a normal degradation degree through classification as Class 1-1 are shown. A graph 200 of FIG. 5 schematically shows actually measured lifespans of battery cells.

As shown in FIG. 5, for the battery cells classified as Class 1-1, SOH values are equal to actually measured values and thus are on the graph 200. On the other hand, for the battery cells belonging to Class 1-2 and Class 1-3, SOH values may have some error with actually measured values and thus are away from the graph 200 by a certain distance. In this case, the distance from the graph 200 may indicate a magnitude of an error.

In addition, referring to a lower side of FIG. 5, an error from an actual SOH value is indicated as a distance to a straight line (Absolute Error). That is, the lower side of FIG. 5 shows a magnitude corresponding to an absolute value of a distance of a point of the battery cells (Prediction) included in Class 1-2 and Class 1-3 from the graph 200. As can be seen from FIG. 5, for battery cells classified as Class 1-1 (the first class) in FIG. 4, they may be determined to be normal (Pass) even when charging and discharging are performed a specific number of cycles, and for the battery cells of Class 1-2 and Class 1-3, SOH values are generally equal to actual SOH values in spite of some error.

Figure 6:
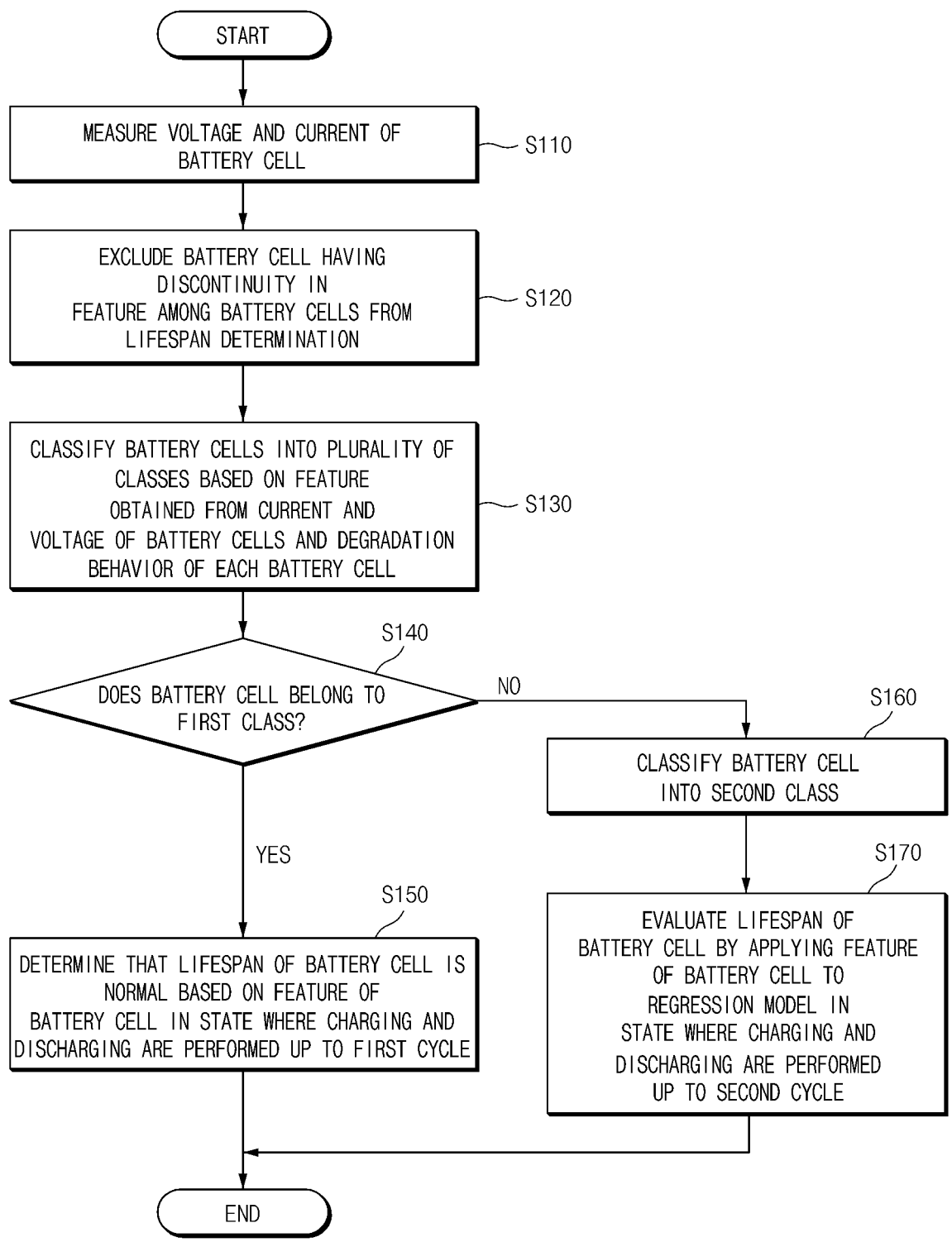
FIG. 6 is a flowchart illustrating a battery management method according to an embodiment disclosed herein.

FIG. 6 is a flowchart illustrating a battery management method according to an embodiment disclosed herein.

Referring to FIG. 6, a battery management method according to an embodiment disclosed herein may measure a voltage and a current of a battery cell in operation S110. In this case, the voltage and the current of the battery cell may be measured at specific time intervals. In operation S110, the measured voltage and current may be used to calculate a feature for each of the battery cells. For example, the feature of the battery cell may be a value calculated based on a differential value (dQ/dV) of a capacity with respect to a voltage of the battery cell.

Among the battery cells, a battery cell having discontinuity in a feature may be excluded from lifespan determination, in operation S120. That is, battery cells including noise caused by static or an error in feature data may be regarded as including abnormality occurring in an experiment process or data calculation, making it impossible to early predict their capacities, and thus may be excluded from analysis. In this case, the battery cell excluded from lifespan determination may be charged and discharged up to cycles (e.g., 300 cycles) set as conventionally and then their capacities may be estimated.

Next, battery cells may be classified into a plurality of classes based on a feature obtained from the current and the voltage of the battery cells and a degradation behavior of each battery cell, in operation S130. More specifically, in operation S130, the battery cells may be classified into the plurality of classes based on a feature change pattern. For example, the feature change pattern may include an initial value of the feature, a change rate (slope) of the feature with respect to a cycle, etc.

In operation S130, an approximate equation regarding the obtained feature data may be calculated and battery cells may be classified into a plurality of classes based on a coefficient of the approximate equation. At this time, the approximate equation may be a first-order or second-order polynomial. For example, the battery cells may be classified into the plurality of classes (clusters) according to a degradation behavior by performing K-means clustering on the coefficient of the approximate equation.

When the battery cell belongs to the first class (Yes) in operation S140, it may be determined that the lifespan of the battery cell is normal based on a feature of the battery cell in a state where charging and discharging are performed up to the first cycle, in operation S150. For example, the first cycle may be 36 cycles.

On the other hand, when the battery cell does not belong to the first class (No) in operation S140, the battery cell may be classified as the second class in operation S160. In addition, in operation S170, in a state where charging and discharging are performed up to the second cycle, the feature of the battery cell may be applied to the regression model to evaluate the lifespan of the battery cell. For example, the second cycle may be greater than the first cycle, and may be 100 cycles.

Herein, the regression model may be a capacity estimation model capable of calculating an SOH value after 300 cycles based on data from 1 to 100 cycles. For example, the regression model is one of neural network methods using machine learning, and may use an estimation model such as Elastic Net, etc.

As such, a battery management method according to an embodiment disclosed herein may early predict a lifespan of a battery cell by classifying battery cells into classes based on data indicating degradation characteristics of the battery cells for capacity estimation.

Figure 7:
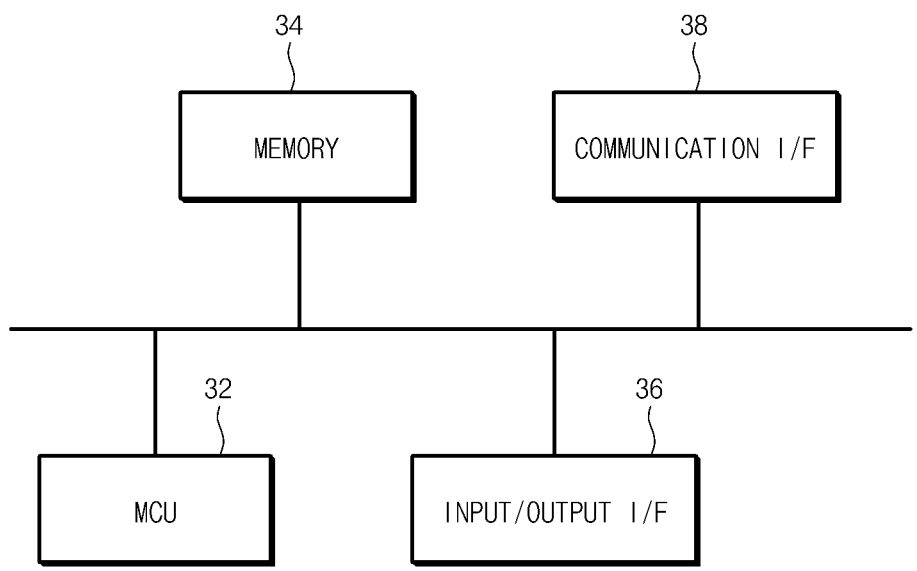
FIG. 7 is a block diagram illustrating a computing system that performs a battery management method according to an embodiment disclosed herein.

FIG. 7 is a block diagram illustrating a computing system that performs a battery management method according to an embodiment disclosed herein.

Referring to FIG. 7, a computing system 30 according to an embodiment disclosed herein may include an MCU (microcontroller unit) 32, a memory 34, an input/output interface (I/F) 36, and a communication I/F 38.

The MCU 32 may be a processor that executes various programs (e.g., a feature calculation program, a class classification and lifespan estimation program, etc.) stored in the memory 34, processes various data including voltage, current, etc., of a battery cell through these programs, and executes the above-described functions of the battery management apparatus shown in FIG. 2.

The memory 34 may store various programs regarding feature calculation, class classification, and lifespan estimation of the battery cell. Moreover, the memory 34 may store various data such as a voltage, a current, feature data, etc., of each battery cell.

The memory 34 may be provided in plural, depending on a need. The memory 34 may be a volatile memory or a nonvolatile memory. For the memory 34 as the volatile memory, random access memory (RAM), dynamic RAM (DRAM), static RAM (SRAM), etc., may be used. For the memory 34 as the nonvolatile memory, read only memory (ROM), programmable ROM (PROM), electrically alterable ROM (EAROM), erasable PROM (EPROM), electrically erasable PROM (EEPROM), flash memory, etc., may be used. The above-listed examples of the memory 34 are merely examples and are not limited thereto.

The input/output I/F 36 may provide an interface for transmitting and receiving data by connecting an input device (not shown) such as a keyboard, a mouse, a touch panel, etc., and an output device such as a display (not shown), etc., with the MCU 32.

The communication I/F 38, which is a component capable of transmitting and receiving various data to and from a server, may be various types of devices capable of supporting wired or wireless communication. For example, a program for feature calculation, class classification, and lifespan estimation for a battery cell or various data, etc., may be transmitted and received to and from a separately provided external server through the communication I/F 38.

As such, a computer program according to an embodiment disclosed herein may be recorded in the memory 34 and processed by the MCU 32, thus being implemented as a module that performs functions shown in FIG. 2.

Even though all components constituting an embodiment disclosed herein have been described above as being combined into one or operating in combination, the embodiments disclosed herein are not necessarily limited to the embodiments. That is, within the object scope of the embodiments disclosed herein, all the components may operate by being selectively combined into one or more.

Moreover, terms such as "include", "constitute" or "have" described above may mean that the corresponding component may be inherent unless otherwise stated, and thus should be construed as further including other components rather than excluding other components. All terms including technical or scientific terms have the same meanings as those generally understood by those of ordinary skill in the art to which the embodiments disclosed herein pertain, unless defined otherwise. The terms used generally like terms defined in dictionaries should be interpreted as having meanings that are the same as the contextual meanings of the relevant technology and should not be interpreted as having ideal or excessively formal meanings unless they are clearly defined in the present document.

The above description is merely illustrative of the technical idea of the present disclosure, and various modifications and variations will be possible without departing from the essential characteristics of embodiments of the present disclosure by those of ordinary skill in the art to which the embodiments disclosed herein pertains. Therefore, the embodiments disclosed herein are intended for description rather than limitation of the technical spirit of the embodiments disclosed herein and the scope of the technical spirit of the present disclosure is not limited by these embodiments disclosed herein. The protection scope of the technical spirit disclosed herein should be interpreted by the following claims, and all technical spirits within the same range should be understood to be included in the range of the present document.

[Description of Reference Numerals]

| | |
|---|---|
| 1: Battery Control System | 10: Battery Pack |
| 12: Plurality of Battery Modules | 14: Sensor |
| 16: Switching Unit | 20: Higher-Level Controller |
| 30: Battery Management Apparatus | 32: MCU |
| 34: Memory | 36: Input/Output I/F |
| 38: Communication I/F | 100: Battery Management Apparatus (BMS) |
| 110: Measuring Unit | 120: Analyzing Unit |
| 130: Determining Unit | |

The invention claimed is:

1. A battery management apparatus comprising:
a measuring unit configured to measure a current and a voltage of battery cells;
an analyzing unit configured to classify the battery cells into a plurality of classes based on a feature obtained from the current and the voltage of the battery cells and a degradation behavior of each of the battery cells; and
a determining unit configured to determine a lifespan of the battery cells in a preset manner for each of the plurality of classes,
wherein the analyzing unit is further configured to classify as a first class, a first battery cell among the battery cells for which the lifespan of the first battery cell is determined to be normal based on a feature of the first battery cell in a state where charging and discharging are performed on the first battery cell up to a first cycle, and classify as a second class, a second battery cell among the battery cells not belonging to the first class in which lifespan determination is possible in a state where charging and discharging are performed on the second battery cell up to a second cycle, and
wherein the second cycle has a value greater than the first cycle.

2. The battery management apparatus of claim 1, wherein the analyzing unit is further configured to exclude a battery cell having a discontinuity in the feature among the battery cells from the lifespan determination.

3. The battery management apparatus of claim 2, wherein the discontinuity includes at least one of noise or an error in feature data.

4. The battery management apparatus of claim 1, wherein the analyzing unit is further configured to classify the battery cells into the plurality of classes based on a change pattern of the feature.

5. The battery management apparatus of claim 4, wherein the change pattern of the feature comprises an initial value of the feature and a change rate for a cycle.

6. The battery management apparatus of claim 1, wherein the determining unit is further configured to determine the lifespan of the second battery cell by applying the feature of the second battery cell to a regression model in the state where charging and discharging are performed on the second battery cell up to the second cycle.

7. The battery management apparatus of claim 6, wherein the regression model is a neural network method using machine learning.

8. The batter management apparatus of claim 6, wherein regression model is a capacity estimation model capable of calculating a state of health (SOH) value after 300 cycles based on data from 1 to 100 cycles.

9. The battery management apparatus of claim 1, wherein the analyzing unit is further configured to classify the battery cells into the plurality of classes based on a coefficient of an approximate equation for the feature.

10. The battery management apparatus of claim 9, wherein the analyzing unit is further configured to perform K-means clustering on the coefficient of the approximate equation.

11. The battery management apparatus of claim 1, wherein the feature is a value calculated based on a differential value (dQ/dV) of a capacity with respect to the voltage of the battery cells.

12. The battery management apparatus of claim 1, wherein the first cycle is approximately 36 cycles and the second cycle is approximately 100 cycles.

13. The battery management apparatus of claim 1, wherein the first class of battery cells, has a smaller degree of degradation than the second class of battery cells.

14. The battery management apparatus of claim 1, wherein the second class includes at least two sub-classes, and
wherein a first sub-class of the second class has a smaller degree of degradation than a second sub-class of the second class.

15. A battery management method comprising:
measuring a current and a voltage of battery cells;
classifying the battery cells into a plurality of classes based on a feature obtained from the current and the voltage of the battery cells and a degradation behavior of each of the battery cells; and
determining a lifespan of the battery cells in a preset manner for each of the plurality of classes,
wherein the classifying of the battery cells into the plurality of classes comprises classifying as a first class, a first battery cell for which the lifespan of the first battery cell is determined to be normal based on a feature of the first battery cell in a state where charging and discharging are performed on the first battery cell up to a first cycle, and classifying as a second class, a second battery cell not belonging to the first class in which lifespan determination of the second battery cell is possible in a state where charging and discharging are performed on the second battery cell up to a second cycle, and
wherein the second cycle has a value greater than the first cycle.

16. The battery management method of claim 15, further comprising excluding a battery cell having discontinuity in the feature among the battery cells from the lifespan determination.

17. The battery management method of claim 15, wherein the classifying of the battery cells into the plurality of classes comprises classifying the battery cells into the plurality of classes based on a change pattern of the feature.

18. The battery management method of claim 17, wherein the classifying of the battery cells into the plurality of classes comprises classifying the battery cells into the plurality of classes based on a slope of the feature.

19. The battery management method of claim 15, wherein the determining of the lifespan of the second battery cell is performed by applying the feature of the second battery cell to a regression model in the state where charging and discharging are performed on the second battery cell up to the second cycle.

20. A battery management apparatus comprising:
a measuring unit configured to measure a current and a voltage of battery cells;
an analyzing unit configured to classify the battery cells into a plurality of classes based on a feature obtained from the current and the voltage of the battery cells and a degradation behavior of each of the battery cells; and
a determining unit configured to determine a lifespan of the battery cells in a preset manner for each of the plurality of classes,
wherein the analyzing unit is further configured to classify the battery cells into the plurality of classes based on a coefficient of an approximate equation for the feature, and is configured to perform K-means clustering on the coefficient of the approximate equation.

* * * * *